(12) United States Patent
Sato et al.

(10) Patent No.: US 7,224,115 B2
(45) Date of Patent: May 29, 2007

(54) DISPLAY APPARATUS AND METHOD OF MANUFACTURING THE SAME

(75) Inventors: Chiyoko Sato, Kanagawa (JP); Jiro Yamada, Kanagawa (JP); Takashi Hirano, Kanagawa (JP); Seiichi Yokoyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 103 days.

(21) Appl. No.: 10/730,666

(22) Filed: Dec. 8, 2003

(65) Prior Publication Data

US 2004/0160170 A1 Aug. 19, 2004

(30) Foreign Application Priority Data

Dec. 11, 2002 (JP) ............................ P2002-358895
Jul. 31, 2003 (JP) ............................ P2003-283527

(51) Int. Cl.
*H01L 51/00* (2006.01)

(52) U.S. Cl. ..................... 313/504; 313/503; 313/506; 313/509; 315/169.3; 257/59; 257/88; 345/76; 345/83; 428/690; 428/917

(58) Field of Classification Search ................ 313/503, 313/504, 506, 509, 500, 505; 257/59, 347, 257/88; 315/169.3; 345/76–83; 428/917, 428/690; 349/69–71, 139, 138, 147
See application file for complete search history.

(56) References Cited

U.S. PATENT DOCUMENTS

| | | | | |
|---|---|---|---|---|
| 4,792,723 A | * | 12/1988 | Igarashi et al. | ............. 313/503 |
| 6,147,451 A | * | 11/2000 | Shibata et al. | ............. 313/506 |
| 6,195,034 B1 | * | 2/2001 | Tsuno et al. | .................... 342/1 |
| 6,366,016 B1 | * | 4/2002 | Sakaguchi et al. | ........... 313/506 |
| 6,656,519 B2 | | 12/2003 | Sakaguchi et al. | |
| 6,900,470 B2 | * | 5/2005 | Kobayashi et al. | ............ 257/88 |
| 2002/0030440 A1 | * | 3/2002 | Yamazaki | ................... 313/503 |

FOREIGN PATENT DOCUMENTS

| | | |
|---|---|---|
| JP | 9-305126 | 11/1997 |
| JP | 10-012377 | 1/1998 |
| JP | 10-069984 | 3/1998 |
| JP | 11-067454 | 3/1999 |
| JP | 11-214157 | 8/1999 |
| JP | 2000-147540 | 5/2000 |

(Continued)

*Primary Examiner*—Karabi Guharay
*Assistant Examiner*—Anthony Canning
(74) *Attorney, Agent, or Firm*—Sonnenschein Nath & Rosenthal LLP

(57) ABSTRACT

Disclosed is a display apparatus including a plurality of lower electrodes patterned on a substrate on the basis of each pixel, an auxiliary wiring composed of the same layer as the lower electrodes and arranged in the state of being insulated from the lower electrodes, an insulating film formed on the substrate and provided with pixel openings for exposing central portions of the lower electrodes and connection holes reaching the auxiliary wiring, organic layers so patterned as to cover bottom portions of the pixel openings and to have end portions partly overlapping on each other between the adjacent pixels, and an upper electrode so formed as to cover the organic layers and to be connected to the auxiliary wiring through the connection holes between the organic layers. Also disclosed is a method of manufacturing the display apparatus.

7 Claims, 6 Drawing Sheets

FOREIGN PATENT DOCUMENTS

| | | |
|---|---|---|
| JP | 2001-195008 | 7/2001 |
| JP | 2002-015623 | 1/2002 |
| JP | 2002-246185 | 8/2002 |
| JP | 2002-318556 | 10/2002 |
| JP | 2003-059660 | 2/2003 |
| JP | 2003-257657 | 9/2003 |
| JP | 2003-288983 | 10/2003 |

* cited by examiner

DISPLAY APPARATUS AND METHOD OF MANUFACTURING THE SAME

RELATED APPLICATION DATA

The present application claims priority to Japanese Application(s) No(s). P2002-358895 filed Dec. 11, 2003, and P2003-283527 filed Jul. 31, 2003, which application(s) is/are incorporated herein by reference to the extent permitted by law.

BACKGROUND OF THE INVENTION

The present invention relates to a display apparatus including organic electroluminescence devices each of which comprises an organic light emission layer, and a method of manufacturing the same.

An organic electroluminescence device utilizing electroluminescence (hereinafter referred to as EL) of an organic material comprises an organic layer composed of a lamination of an organic hole transport layer and an organic light emission layer between a lower electrode and an upper electrode, and has drawn attention as a light emitting device capable of high-luminance light emission when driven by a low-voltage DC current.

An active matrix type display apparatus using such organic EL devices (namely, an organic EL display) comprises thin film transistors arranged at each pixel on a substrate. The organic EL devices are formed on an interlayer insulating film provided so as to cover the thin film transistors. The organic EL device is comprised of a lower electrode patterned on the basis of each pixel in the state of being connected to the thin film transistor, an insulating film surrounding a central portion of the lower electrode while exposing the central portion as a pixel opening, an organic layer provided on the lower electrode in the pixel opening which is separated by the insulating film, and an upper electrode provided in the state of covering the organic layer. Of these components, the upper electrode is formed for example as a solid-printed-like film covering a plurality of pixels, and is used as an upper common electrode between the plurality of pixels.

In the active matrix type display apparatus, in order to secure the numerical aperture of the organic EL devices, it is effective to configure the display apparatus as the so-called top emission type structure in which light is taken out on the side opposite to the substrate. Therefore, the upper electrode is required to be thinned for securing a light-transmitting property, which tends to raise resistance value, thereby easily causing a voltage drop.

In view of this problem, there has been proposed a structure in which an auxiliary wiring formed of a highly conductive metallic material is formed on the insulating film between the pixel openings, and the upper electrode is connected to the auxiliary electrode, thereby preventing the voltage drop in the upper electrode. The auxiliary wiring may be formed as a part of a member constituting a rib on the insulating film covering the portion between the pixel openings, as shown for example in Patent Reference 1 given below. The rib is a portion on which a vapor deposition mask is mounted in the step of vapor depositing the organic layer after the formation of the insulating film (see Patent Reference 1). Also, there has been proposed a configuration in which the auxiliary wiring is composed of the same layer as that of the lower electrodes, and the organic layer is independently formed on each of the lower electrodes (see Patent Reference 2 given below).

Patent Reference 1: Japanese Patent Laid-open No. 2001-195008 (page 4 and FIG. 1)

Patent Reference 2: Japanese Patent Laid-open No. 2002-318556

In the display apparatus having the auxiliary wiring in the configuration shown in Patent Reference 1, however, a special layer for forming the auxiliary wiring is provided, leading to a complication of the layer structure in the display apparatus. Besides, a special step for forming the auxiliary wiring is needed, causing an increase in the number of steps for manufacturing the display apparatus.

The complication of the layer structure and the increase in the number of manufacturing steps cause increases in the product cost and manufacturing cost of the display apparatus, and cause a lowering in yield due to a trouble peculiar to the increased number of manufacturing steps.

In addition, in the configuration in which the auxiliary wiring is composed of the same layer as that of the lower electrodes as shown in Patent Reference 2, the organic layer is independently formed on the lower electrodes, and it is necessary to enlarge the spacing between the pixel openings so that the adjacent organic layers do not overlap on each other. This hinders enhancement of the degree of integration of pixels and enhancement of fineness of display performance.

SUMMARY OF THE INVENTION

Accordingly, it is an object of the present invention to provide a display apparatus in which an auxiliary wiring connected to an upper electrode of organic EL devices can be formed without complicating the layer structure and without increasing the number of steps and which is capable of high-definition display, and a method of manufacturing the same.

In order to attain the above object, according to one aspect of the present invention, there is provided a display apparatus in which a plurality of lower electrodes are patterned on the basis of each pixel on a substrate, and an auxiliary wiring is disposed in the state of being insulated from the lower electrodes. The lower electrodes and the auxiliary electrode are composed of the same layer. In addition, an insulating film is provided on the substrate, the insulating film being provided with pixel openings for exposing central portions of the lower electrodes and a connection hole reaching the auxiliary wiring. Further, an organic layer is patterned on the lower electrodes in the state of covering bottom portions of the pixel openings and having end portions partly overlapping on each other between the adjacent pixels, and an upper electrode covering the organic layer is provided. The upper electrode is connected to the auxiliary wiring through a connection hole formed in the insulating film between the organic layers.

In the display apparatus configured as above, the auxiliary wiring connected to the upper electrode is composed of the same layer as that of the lower electrodes, instead of being composed of a special layer. Therefore, the electric resistance of the upper electrode can be lowered by connection to the auxiliary wiring, without complicating the layer structure of the display apparatus. Besides, the configuration in which end portions of the organic layers partly overlap on each other between the adjacent pixels ensures that the upper electrode can be connected to the auxiliary electrode between the organic layers while miniaturizing the pitch of the pixel openings whose bottom portions are wholly covered with the patterned organic layers.

According to another aspect of the present invention, there is provided a method of manufacturing a display apparatus, which is a method of manufacturing the display apparatus configured as above, characterized by the following procedure. First, a conductive film formed on a substrate is, patterned, whereby a plurality of lower electrodes corresponding respectively to pixels and an auxiliary wiring insulated from the lower electrodes are formed. Next, an insulating film provided with pixel openings for exposing central portions of the lower electrodes and a connection hole reaching the auxiliary wiring is formed on the substrate. Subsequently, an organic layer is patternedly formed in the state of covering bottom portions of the pixel openings and having end portions partly overlapping on each other between the adjacent pixels. Next, an upper electrode covering the organic layer and connected to the auxiliary wiring through the connection hole between the organic layers is formed.

In the above manufacturing method, the auxiliary wiring is formed in the same step as that for patterningly forming the lower electrodes, the connection hole reaching the auxiliary wiring is formed simultaneously with the formation of the pixel openings for exposing the central portions of the lower electrodes, and the upper electrode is so formed as to be connected to the auxiliary wiring through the connection hole. Therefore, there is obtained the display apparatus in which the upper electrode is connected to the auxiliary wiring without increasing the number of steps. In addition, the organic layer is patternedly formed in the state of covering the bottom portions of the pixel openings and having end portions partly overlapping on each Other between the adjacent pixels, whereby it is possible to miniaturize the pitch of the pixel openings whose bottom portions are wholly covered with the patterned organic layer. Besides, since the upper electrode is connected to the auxiliary wiring between non-overlapping portions of the organic layer, it is unnecessary to etch the organic layer for the connection.

According to the display apparatus and the manufacturing method thereof according to the present invention, the auxiliary wiring connected to the upper electrode is composed of the same layer as that formed in the same step as that for forming the lower electrodes, whereby a display apparatus with a small pixel pitch in which the electric resistance of the upper electrode is lowered by connection to the auxiliary wiring can be obtained without complicating the layer structure and the manufacturing steps of the display apparatus. As a result, a display apparatus in which good display characteristics are maintained by preventing a voltage drop in an upper electrode and which is capable of high-definition display can be obtained at low cost and in good yield.

BRIEF DESCRIPTION OF THE DRAWINGS

The above and other objects, features and advantages of the present invention will become apparent from the following description and appended claims, taken in conjunction with the accompanying drawings, in which:

DESCRIPTION OF THE PREFERRED EMBODIMENTS

Figure 1:
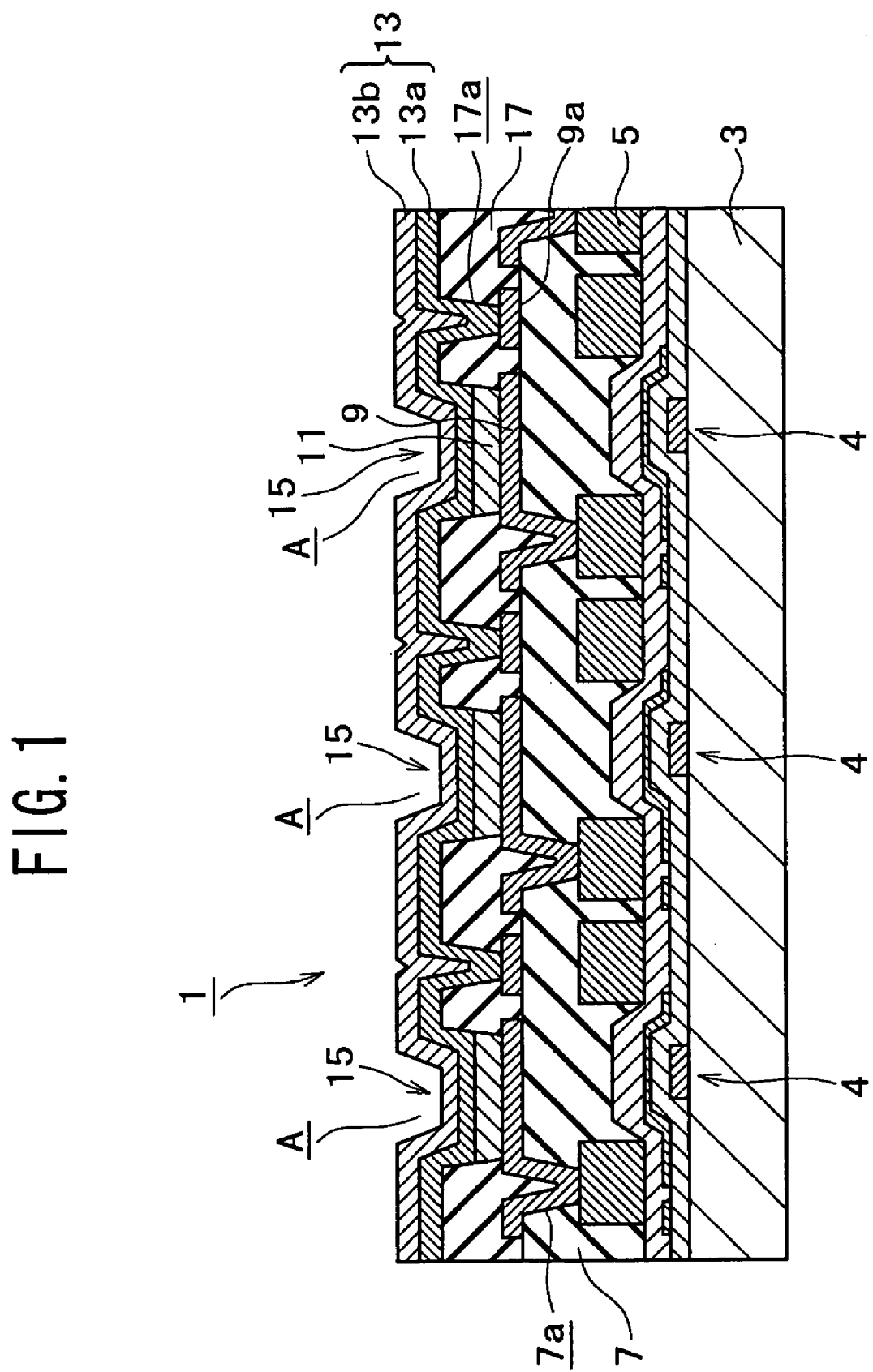
FIG. 1 is a sectional view of an essential part for illustrating a display apparatus according to a first embodiment of the present invention.

Now, the display apparatus and the manufacturing method thereof according to the present invention will be described in detail below referring to the drawings.

<Display Apparatus 1>

FIG. 1 is a sectional view of an essential part showing the general configuration of a display region in a display apparatus according to a first embodiment of the present invention. The display apparatus 1 shown in the figure is an active matrix type display apparatus in which organic EL devices are arranged as light-emitting devices.

The display apparatus 1 comprises thin film transistors (hereinafter referred to as TFT) 4 at each pixel on a substrate 3. On the substrate 3 provided thereon with the TFTs 4, a wiring 5 connected to the source/drain of the TFTs 4 is formed, and a planarizing insulation film 7 is provided in the state of covering the wiring 5. The TFT 4 is not limited to the bottom gate type shown, and may be of the top gate type, and its gate electrode is connected to a scan circuit.

An organic EL device 15 composed of a lamination of a lower electrode 9, an organic layer 11, and an upper electrode 13 is provided at the portion of each pixel opening A on the planarizing insulation film 7. Particularly in the display apparatus 1 in this embodiment, an auxiliary wiring 9a composed of the same layer as that of the lower electrodes 9 is provided between the pixel openings A where the organic EL devices 15 are provided. The pixel openings A are opening portions formed in an insulating film 17 covering the lower electrodes 9.

Here, the lower electrode 9 constituting the organic EL device 15 is patterned in the state of being connected to an aluminum wiring 5 through a connection hole 7a formed in the planarizing insulation film 7 and being larger than the pixel opening A.

The auxiliary wiring 9a composed of the same layer as that of the lower electrodes 9 is continuously disposed in a mesh form between the pixel openings A arranged, for example, in a matrix form on the substrate 3, and is patterned in the state of being insulated from the lower electrodes 9.

The peripheries of the lower electrodes 9 and the auxiliary wiring 9a are covered with an insulating film 17 for exposing central portions of the lower electrodes 9, and the opening portions of the insulating film 17 for exposing the central portions of the lower electrodes 9 are pixel openings A. The insulating film 17 is provided with the pixel openings A and with connection holes 17a reaching the auxiliary wiring 9a. The connection holes 17a are provided at positions as required, and may not necessarily be provided in correspondence with each of the pixel openings A.

An organic layer 11 is patternedly formed on the basis of each of the pixel openings A so as to cover the upper side of the lower electrodes exposed in the pixel openings A defined by the insulating film 17.

An upper electrode 13 is provided in the state of wholly covering the upper side of the organic layer 11 and being connected to the auxiliary wiring 9a through the connection holes 17a provided in the insulating film 17. The upper electrode 13 may be provided as a solid-printed-like film on the upper side of the substrate 3, or may be patternedly formed on the basis of a plurality of portions in the state of being shared by a plurality of the pixels.

Meanwhile, the display apparatus 1 comprises the TFTs 4 formed on the basis of each pixel on the substrate. Therefore, the top emission type in which emitted light is taken out on the side of the upper electrode 13 opposite to the side of the substrate 3 is advantageous for securing the numerical aperture of the organic EL devices. In this case, the substrate 3 is not limited to one formed of a transparent material.

Where the display apparatus 1 is of the top emission type, it is preferable to form the lower electrodes 9 of a highly light-reflective metallic material such as aluminum (Al), silver (Ag), a silver (Ag)-based alloy, and chromium (Cr), thereby reflecting the emitted light to the side of the upper electrode 13. Particularly, use of silver (Ag) or a silver alloy is preferable, since more emitted light can be reflected.

In this case, also, for the purpose of planarizing the surfaces of the lower electrodes 9, a two-layer structure may be adopted in which a conductive oxide material layer having excellent surface planarness and being light-transmitting is provided on the metallic material layer. The conductive oxide material layer serves also as a barrier layer for preventing oxidation of the highly reflective metallic material layer such as silver (Ag), particularly.

Furthermore, a three-layer structure may be adopted in which a conductive oxide material layer is provided as a close contact layer for the planarizing insulation film 7 functioning as a base, beneath the metallic material layer, thereby sandwiching the metallic material layer between the conductive oxide material layers.

The lower electrodes 9 are used as anodes or cathodes, and a material having an appropriate work function is selected therefor according to whether the lower electrodes 9 are used as anodes or cathodes. For example, where the lower electrodes 9 are used as anodes, a material having a great work function is used as a hole injection layer for the uppermost layer in contact with the organic layer 11. Therefore, where the lower electrodes 9 have the two-layer structure or the three-layer structure, indium oxide such as ITO (Indium Tin Oxide) and IZO (Indium Zinc Oxide) having a great work function and a good light-transmitting property is used as the conductive oxide material layer constituting the uppermost layer. In addition, ITO or IZO is used also as the conductive oxide material layer provided as the close contact layer between the metallic material layer and the planarizing insulation film 7.

From the foregoing, examples of the configuration of the lower electrodes 9 used as anodes and of the auxiliary wiring 9a include a three-layer structure in which a metallic material layer formed of silver (Ag) is sandwiched between conductive oxide material layers formed of ITO.

In addition, the organic layer 11 has a laminated structure including at least a light emission layer, which is formed, for example, by sequentially laminating a hole injection layer, a light emission layer, an electron transport layer, and an electron injection layer or the like in this order from the anode side.

Furthermore, where the display apparatus 1 is of the top emission type, the upper electrode 13 is formed of a light-transmitting material, and, for obtaining a good light take-out efficiency, it is preferable that the upper electrode 13 is formed in a sufficiently small film thickness. Where the lower electrodes 9 are anodes, the upper electrode 13 is used as a cathode. Therefore, where the upper electrode 13 has a multi-layer structure including two or more layers, the lowermost layer 13a in contact with the organic layer 11 is formed by use of a material having a small work function, for example, a magnesium-silver (Mg:Ag) alloy. Besides, the upper layer 13b is formed by use of a conductive material having a good light-transmitting property such as, for example, IZO and ITO.

On the contrary to the above, where the display apparatus 1 is of the transmission type in which emitted light is taken out on the side of the substrate 3, the substrate 3 and the lower electrodes 9 are formed of a light-transmitting material. On the other hand, the upper electrode 13 is formed of a highly light-reflective material.

In the display apparatus 1 constituted as above, the auxiliary wiring 9a connected to the upper electrode 13 is composed of the same layer as that of the lower electrodes 9, instead of being composed of a special layer. This makes it possible to electrically lower the resistance of the upper electrode 13 by connection to the auxiliary wiring 9a, without complicating the layer structure of the display apparatus 1. Therefore, even where the upper electrode 13 is required to be light-transmitting and the upper electrode 13 is reduced in film thickness because the display apparatus 1 is of the top emission type in which emitted light is taken out on the side of the upper electrode 13, it is possible to lower the resistance of the upper electrode 13, without complicating the layer structure, and to thereby prevent voltage drop in the upper electrode 13. As a result, it is possible to maintain the display characteristics of the display apparatus at a good level.

<Manufacturing Method 1>

Now, one example of the method of manufacturing the display apparatus constituted as above and a specific example of detailed constitution of the display apparatus will be described below, along the manufacturing procedure thereof based on the process charts shown in FIGS. 2A to 2C and FIGS. 3A to 3C.

Figure 2A:
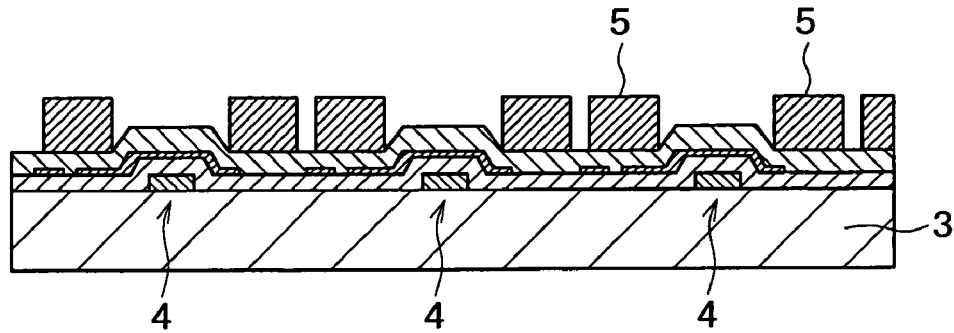
FIGS. 2A to 2C are sectional process charts (No. 1) for illustrating a method of manufacturing the display apparatus according to the first embodiment.

First, as shown in FIG. 2A, TFTs 4 and a wiring 5 connected to source/drain regions of the TFTs 4 are formed on a substrate 3, for example, a glass substrate.

Figure 2B:
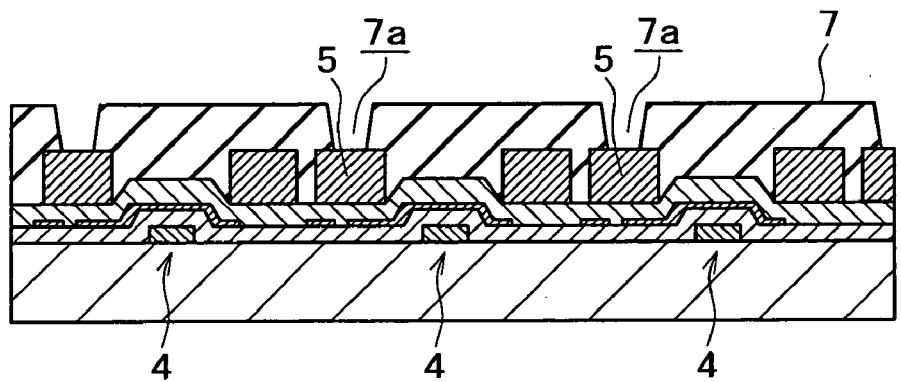

Thereafter, as shown in FIG. 2B, a planarizing insulation film 7 is formed on the substrate 3 so as to flatten the recesses and projections generated on the face side of the substrate 3 due to the formation of the TFTs 4 and the wiring 5. In this case, for example, a positive type photosensitive polyimide is applied to the substrate 3 by a spin coating method, then pattern exposure is conducted for irradiating only the upper portions of the wiring 5 with light by use of an exposure apparatus, and development is conducted by a paddle type developing apparatus. Next, true baking for imidizing (cyclizing) the polyimide is carried out in a clean baking furnace. This forms the planarizing insulation film 7 provided with connection holes 7a reaching the wiring 5. Where the ruggedness (the recesses and projections) upon the formation of the wiring 5 is about 1.0 µm, for example, the planarizing insulation film 7 is formed in a film thickness of about 2.0 µm.

Figure 2C:
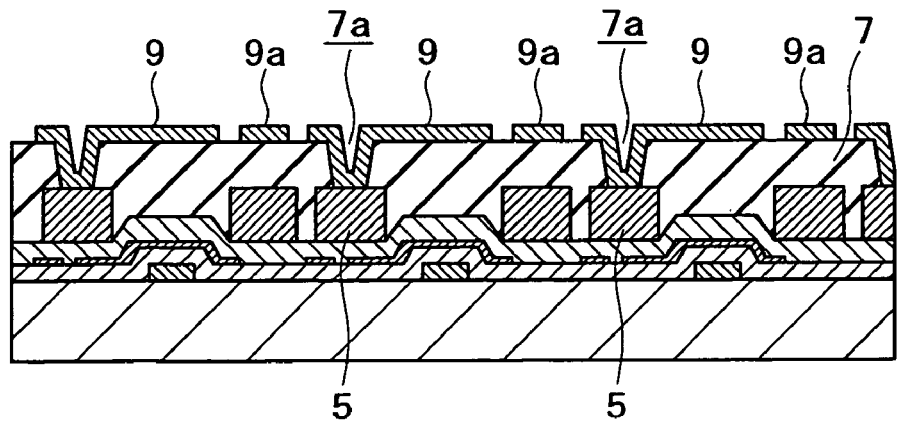

Next, as shown in FIG. 2C, lower electrodes 9 and auxiliary electrodes 9a are formed on the planarizing insulation film 7. Here, for example, the lower electrodes 9 as anodes are formed. In this case, first, a film of a conductive oxide material (for example, ITO) for constituting a close contact layer is formed on the planarizing insulation film 7 in a film thickness of about 20 nm by a DC sputtering method. Next, a film of a metallic material (for example, Ag) is formed in a film thickness of about 100 nm by DC sputtering. Thereafter, a film of a conductive oxide material (for example, ITO) for constituting a barrier layer, a hole injection layer and a planarizing layer is formed on the metallic material layer in a film thickness of about 10 nm by DC sputtering.

Incidentally, the conductive oxide material layer formed as the close contact layer is required only to have a film thickness capable of close contact, and the film thickness is 5 to 100 nm where the conductive oxide material is ITO. Further, the metallic material layer is required only to be processable and not to transmit light therethrough, and is formed in a thickness of 50 to 500 nm where the metallic material is Ag. Furthermore, the conductive oxide material layer for constituting the barrier layer, the hole injection layer and the planarizing layer is formed in a film thickness of 3 to 50 nm, which corresponds to the limit of processing.

Next, etching is conducted by using as a mask a resist pattern formed by the ordinary lithography technique, whereby the metallic material layer and the conductive oxide material layer are patterned. By this, the lower electrodes 9 connected to the wiring 5 through the connection holes 7a are arranged in a matrix form corresponding to each of pixel portions, and the auxiliary electrodes 9a are formed between the lower electrodes 9.

Incidentally, where the lower electrodes 9 and the auxiliary wiring 9a are formed to have a two-layer structure, a metallic material layer (for example, Ag) is formed in a film thickness of about 150 nm by DC sputtering, then an ITO layer is formed in a film thickness of about 10 nm, and these layers are patterned.

Figure 3A:
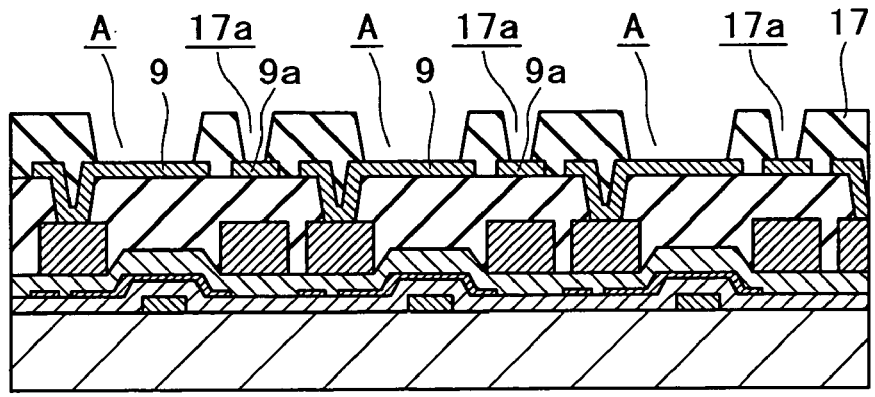
FIGS. 3A to 3C are sectional process charts (No. 2) for illustrating the method of manufacturing the display apparatus according to the first embodiment.

Thereafter, as shown in FIG. 3A, an insulating film 17 having pixel openings A and connection holes 17a is formed. Here, first, a silicon dioxide ($Sio_2$) film is formed in a film thickness of about 1.0 μm by a CVD method, for example. Thereafter, etching is conducted by using as a mask a resist pattern formed by the ordinary lithography technique, whereby the silicon dioxide film is patterned. In this case, the etching is conducted under such conditions that the etched side walls become tapered in shape. As a result, the insulating film 17 composed of the silicon dioxide film, provided with the pixel openings A for exposing central portions of the lower electrodes 9 and the connection holes 17a reaching the auxiliary electrodes 9a, is obtained. Incidentally, the insulating film 17 is not limited to the silicon dioxide film.

Figure 3B:
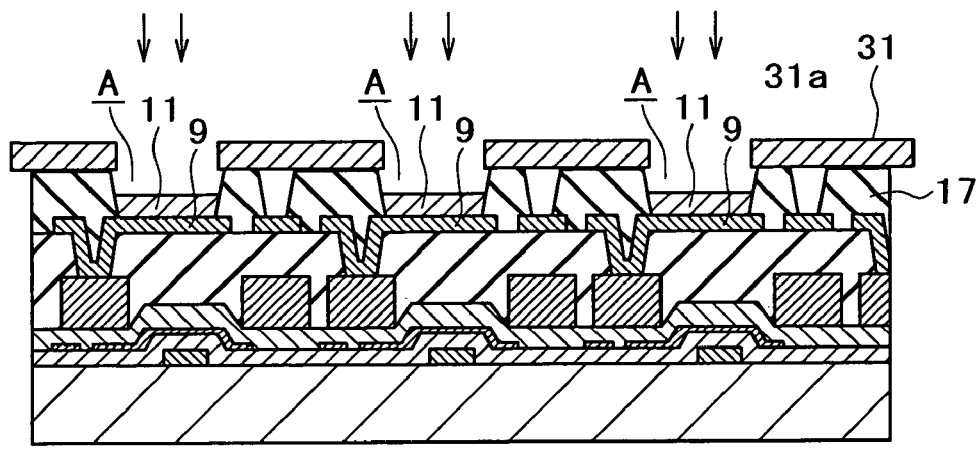

Next, as shown in FIG. 3B, an organic layer 11 is patternedly formed which has such a shape as to cover the lower electrodes 9 exposed at bottom portions of the pixel openings A. Here, with a vapor deposition mask 31 disposed on the upper side of and oppositely to the insulating film 17, film formation by vapor deposition is conducted by use of a low molecular weight organic material. The vapor deposition mask 31 is provided with opening portions 31a corresponding to the areas where the organic layer 11 is formed. Besides, in order to form the organic layer 11 in the state of securely covering the lower electrodes 9 exposed inside the pixel openings A, the vapor deposition mask 31 is so designed that the opening portions 31a overlap on the side walls of the insulating film 17 at the peripheries of the pixel openings A and that the exposed portions of the lower electrodes 9 are entirely exposed, as viewed in plan view from the side of the vapor deposition mask 31.

By film formation by vapor deposition using the vapor deposition mask 31, the organic layer 11 is formed which is composed of, for example, a hole injection layer formed of 4,4',4"-tris(3-methylphenylphenylamino)-triphenylamine (MTDATA), a hole transport layer formed of bis(N-naphthyl)-N-phenylbenzidine (α-NPD), and a light emission layer formed of 8-quinolaluminum complex (Alq3), in this order from the side of the lower electrodes 9.

In this case, each of the materials for constituting the organic layer 11, in an amount of 0.2 g, is placed in a boat for resistance heating, and the boat is attached to predetermined electrodes in a vacuum vapor deposition apparatus. After a vapor deposition chamber is evacuated to a vacuum of about $0.1 \times 10^{-4}$ Pa, a voltage is impressed sequentially on the boats, whereby the plurality of organic materials are sequentially vapor deposited to form a film. The film thickness of MTDATA as the hole injection layer is about 30 nm, that of α-NPD as the hole transport layer is about 20 nm, and that of Alq3 as the light emission layer is about 30 nm.

Incidentally, in the case of the film formation by vapor deposition, the vapor deposition mask 31 and the substrate 3 may be maintained with a predetermined spacing therebetween by mounting the vapor deposition mask 31 on the insulating film 17.

Figure 3C:
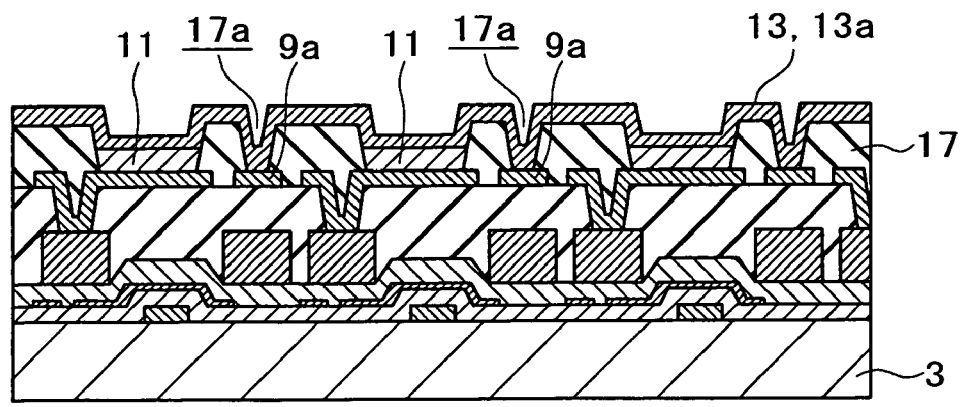

Thereafter, as shown in FIG. 3C, an upper electrode 13 is formed which covers the upper side of the organic layer 11 and the insulating film 17 and which is connected to the auxiliary wiring 9a through the connection holes 17a formed in the insulating film 17. Here, first, a film of Mg-Ag for constituting a cathode is formed on the whole surface of the substrate 3, as a lower layer 13a of the upper electrode 13, by co-vapor deposition.

In this case, 0.1 g of Mg and 0.4 g of Ag are placed in boats, and the boats are attached to predetermined electrodes in a vacuum vapor deposition apparatus. Then, after the vapor deposition chamber is evacuated to a vacuum of about $0.1 \times 10^{-4}$ Pa, a voltage is impressed on each of the boats, whereby Mg and Ag are co-vapor deposited on the substrate 3. As an example, the ratio between the film formation speeds of Mg and Ag is set to be about 9:1, and the film is formed in a film thickness of about 10 nm.

Incidentally, the formation of the organic layer 11 and the formation of the lower layer 13a of the upper electrode 13 are both conducted by film formation by vapor deposition, and, therefore, the formations are conducted continuously in the same vapor deposition chamber. It should be noted, however, that when the vapor deposition film formation of the lower layer 13a of the upper electrode 13 is conducted after completion of the vapor deposition film formation of the organic layer 11, the vapor deposition mask (31) is removed from the upper side of the substrate 3.

Thereafter, as shown in FIG. 1, an uppermost layer 13b of the upper electrode 13 is formed on the lower layer 13a of the upper electrode 13. The uppermost layer 13b is composed of a transparent conductive film, and is formed by DC sputtering. Here, as an example, an In—Zn—O based transparent conductive film showing good conductivity when formed at room temperature is formed in a film thickness of about 200 nm, as the uppermost layer 13b.

By the above procedure, the display apparatus 1 constituted as described above referring to FIG. 1 is obtained.

According to the above-described manufacturing method, as described referring to FIG. 2C, the auxiliary wiring 9a is formed in the same step as that for formation of the lower electrodes 9. Besides, as described referring to FIG. 3A, the connection holes 17a reaching the auxiliary wiring 9a are formed in the same step as that for formation of the pixel openings A in the insulating film 17. Then, as described referring to FIG. 3C and FIG. 1, the upper electrode 13 is formed so as to cover the organic layer 11 and to be connected to the auxiliary wiring 9a through the connection holes 17a. Therefore, a display apparatus in which the auxiliary wiring 9a is connected to the upper electrode 13, namely, the display apparatus 1 described referring to FIG. 1 can be obtained, without adding a step.

By the foregoing, it is possible to reduce the manufacturing cost of the display apparatus including the auxiliary wiring 9a connected to the upper electrode 13, and to achieve a higher yield through a reduction in the number of manufacturing steps.

<Display Apparatus 2>

Figure 4A:
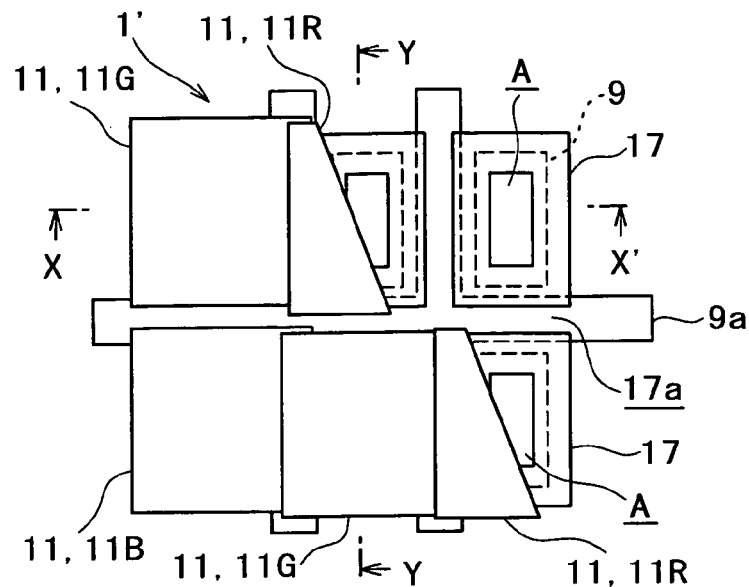
FIGS. 4A to 4C are drawings for illustrating a display apparatus according to a second embodiment of the present invention.
Figure 4B:
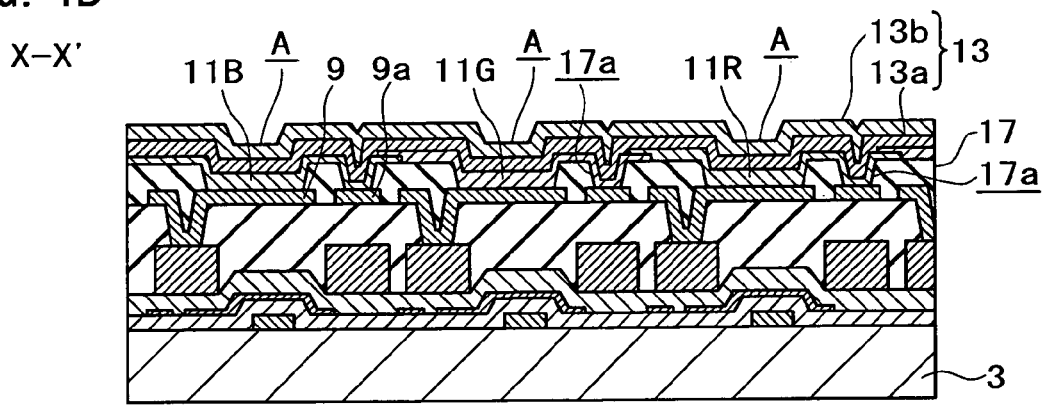
Figure 4C:
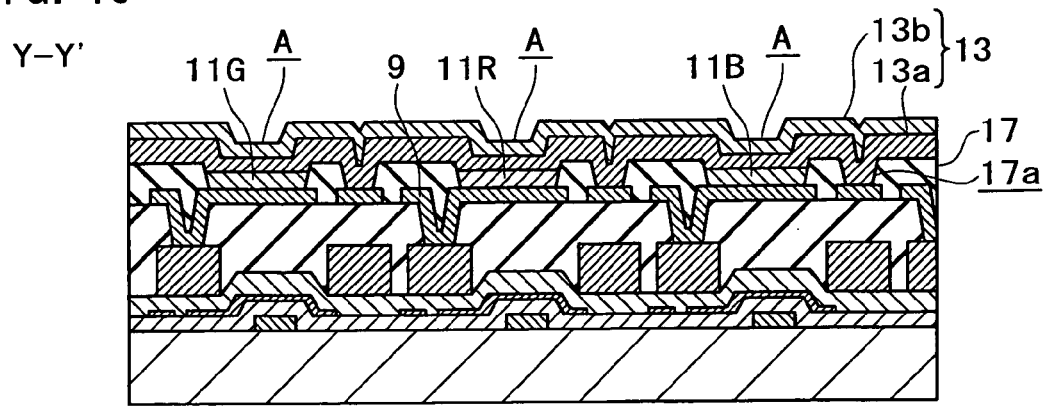

FIG. 4A is a general plan view of a display region in a display apparatus according to a second embodiment; FIG. 4B is a sectional view taken along line X–X' of FIG. 4A; and FIG. 4C is a sectional view taken along line Y–Y' of FIG. 4A. The display apparatus 1' according to the second embodiment shown in these figures differs from the display apparatus according to the first embodiment described referring to FIG. 1 in that the organic layers 11 covering the bottom portions of the pixel openings A are patternedly formed in the state of having end portions partly overlapping on each other between the adjacent pixels. The other aspects are the same as those in the first embodiment, and description thereof is therefore omitted.

The organic layers 11 are, for example, an organic layer 11B for blue light emission, an organic layer 11G for green light emission, and an organic layer 11R for red light emission, which are arranged orderly in the state of covering the pixel openings A. These organic layers 11B, 11G and 11R are disposed in the state of having their end portions overlapping on each other between the pixel openings A arranged in the horizontal direction (X–X' direction). On the other hand, between the pixel openings A arranged in the vertical direction (Y–Y' direction), the organic layers 11B, 11G and 11R do not overlap on each other, and a spacing is provided between the organic layers 11B, 11G and 11R.

Here, for example, connection holes 17a formed in the insulating film 17 so as to reach the auxiliary wiring 9a are formed in a groove shape along the auxiliary wiring 9a disposed continuously in a mesh form between the pixel openings A, and, between the pixel openings A arranged in the horizontal direction (X–X' direction), the upper side of the auxiliary wiring 9 is covered by the organic layers 11B, 11G and 11R. On the other hand, between the pixel openings A arranged in the vertical direction (Y–Y' direction), the portions of the connection holes 17a formed in the insulating film 17 covering the lower electrodes 9 are exposed from the organic layers 11B, 11G and 11R. Therefore, the upper electrode 13 (omitted in the plan view) and the auxiliary wiring 9a are connected to each other at the portions of the connection holes 17a between the pixel openings A arranged in the vertical direction (Y–Y' direction).

The display apparatus 1' constituted as above has the same effects as those of the display apparatus 1 according to the first embodiment described referring to FIG. 1, and, in addition, makes it possible to miniaturize the pitch of the pixel openings A whose bottom portions are wholly covered by the organic layers 11B, 11G and 11R, due to the structure in which end portions of the organic layers 11B, 11G and 11R partly overlap on each other between the adjacent pixel openings A. Moreover, since only parts of the organic layers 11B, 11G and 11R overlap on each other, the upper electrode 13 can be connected to the auxiliary wiring 9a between the portions where the organic layers 11B, 11G and 11R do not overlap on each other. Therefore, it is possible to obtain a display apparatus in which the resistance of the upper electrode is electrically lowered and the pixel pitch is small. As a result, voltage drop in the upper electrode is prevented, good display characteristics can thereby be maintained, and high-definition display can be achieved.

Figure 5:
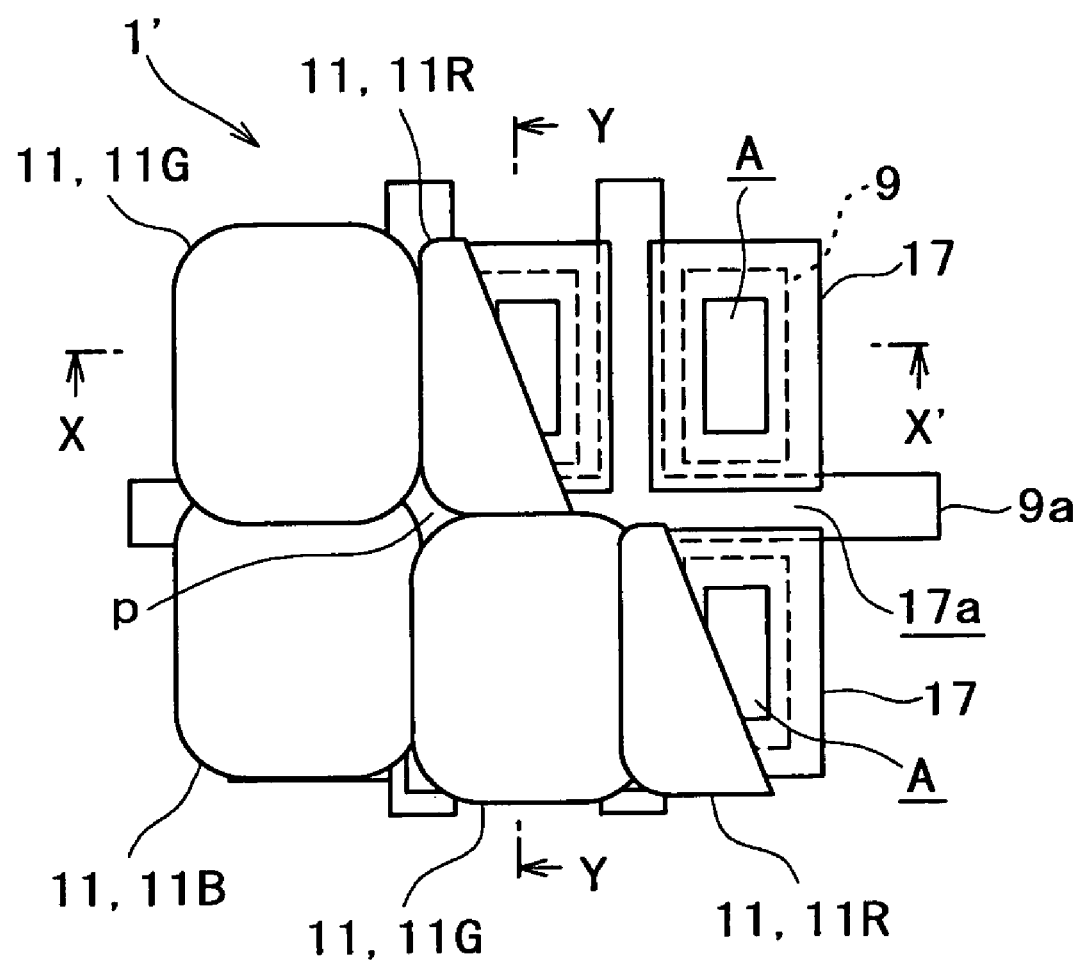
FIG. 5 is a plan view for illustrating other configurations of the display apparatus according to the second embodiment.

In the foregoing, the configuration in which the organic layers 11B, 11G and 11R are disposed to have their end portions overlapping on each other only between the pixel openings A arranged in the horizontal direction (X–X') direction has been described. However, as shown in the plan view of FIG. 5, the organic layers 11B, 11G and 11R may overlap on each other between the pixel openings A arranged in the horizontal direction (X–X' direction) and the vertical direction (Y–Y' direction), inasmuch as a spacing p is provided between the organic layers 11B, 11G and 11R arranged adjacently in part. In this case, connection between the upper electrode (omitted in the figure) and the auxiliary wiring 9a is attained in the spacing p.

<Manufacturing Method>

In the next place, a method of manufacturing the display apparatus constituted as above will be described based on the manufacturing process charts shown in FIGS. 6A to 6C.

Figure 6A:
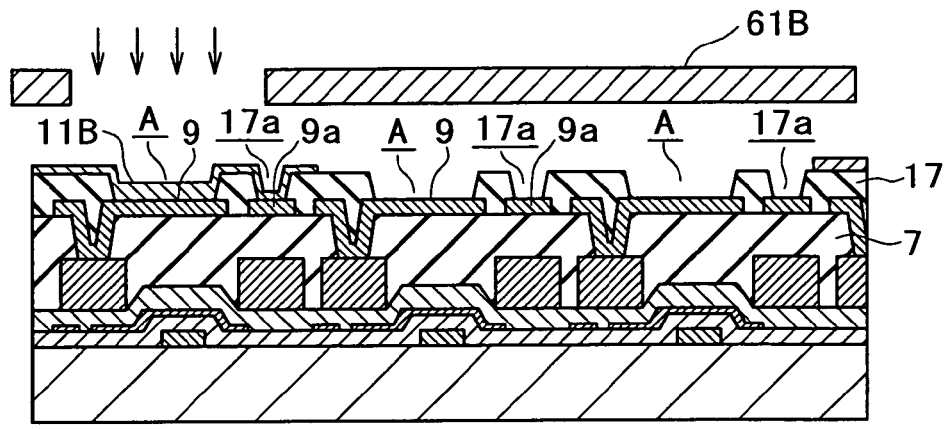
FIGS. 6A to 6C are sectional process charts for showing a method of manufacturing the display apparatus according to the second embodiment.
Figure 6B:
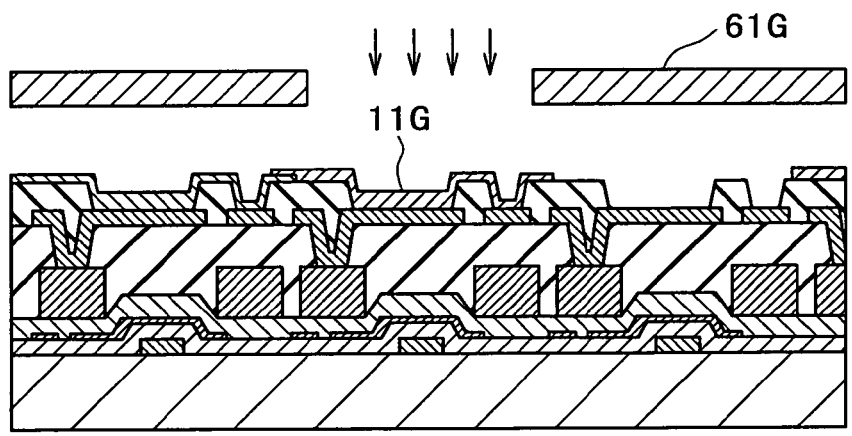
Figure 6C:
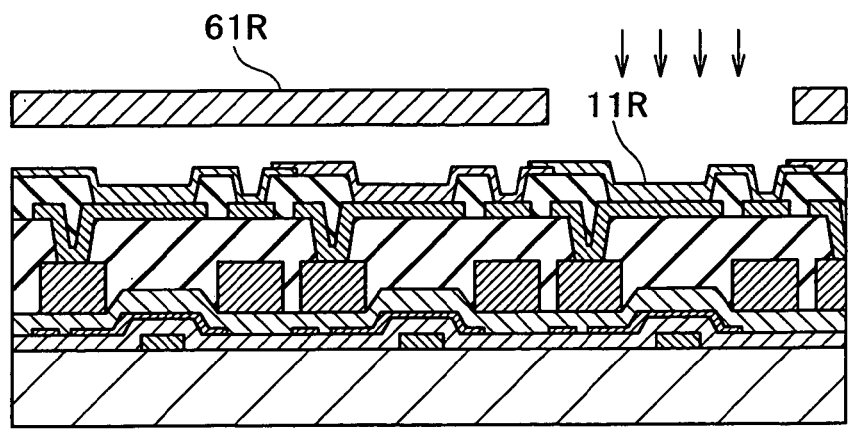

First, as shown in FIG. 6A, the steps up to the step described referring to FIG. 3A in the manufacturing method according to the first embodiment are conducted, whereby the insulating film 17 having the pixel openings A and the connection holes 17a is formed on the planarizing insulation film 7 provided thereon with the lower electrodes 9 and the auxiliary wiring 9a. In this condition, baking is conducted in a nitrogen gas ($N_2$) atmosphere, and then a pretreatment of the substrate with an oxygen gas ($O_2$) plasma is conducted.

Thereafter, while the vacuum is maintained, the work is transported into a chamber for vapor deposition of a blue organic layer. In the chamber, a vapor deposition mask 61B for blue is aligned, and materials for forming a hole injection layer, a hole transport layer, a light emission layer and an electron transport layer are sequentially vapor deposited, thereby forming the organic layer 11B for blue light emission. In this case, the total film thickness of the organic layer is, for example, 70 nm.

Next, while the vacuum is maintained, the work is transported into a chamber for vapor deposition of a green organic layer. In the chamber, as shown in FIG. 6B, a vapor deposition mask 61G for green is aligned, and materials for forming a hole injection layer, a hole transport layer, a light emission layer and an electron transport layer are sequentially vapor deposited, thereby forming the organic layer 11G for green light emission. In this case, the total film thickness of the organic layer is, for example, 110 nm.

Subsequently, while the vacuum is maintained, the work is transported into a chamber for vapor deposition of a red organic layer. In the chamber, as shown in FIG. 6C, a vapor deposition mask 61R for red is aligned, and materials for forming a hole injection layer, a hole transport layer, a light emission layer and an electron transport layer are sequentially vapor deposited, thereby forming the organic layer R for red light emission. In this case, the total film thickness of the organic layer is, for example, 150 nm.

In the pattern formation of each of the organic layers 11B, 11G and 11R, film formation by vapor deposition using a low molecular weight organic material is conducted. The vapor deposition is so conducted that the organic layers 11B, 11G and 11R partly overlap on each other between the pixel openings A and that a spacing is provided between the organic layers 11B, 11G and 11R at parts of the areas between the pixel openings A.

Thereafter, the upper electrode 13 is formed in the same manner as described referring to FIG. 3C and FIG. 1 in the first embodiment.

According to the above-described manufacturing method, like in the manufacturing method according to the first embodiment, the auxiliary wiring 9a is formed in the same step as that for formation of the lower electrode 9. Therefore, like in the manufacturing method according to the first embodiment, it is possible to reduce the manufacturing cost of the display apparatus, and to achieve a higher yield through the reduction in the number of manufacturing steps. Besides, in the pattern formation of the organic layers 11B, 11G and 11R, the vapor deposition is so conducted that the organic layers 11B, 11G and 11R overlap on each other between the pixel openings A and that a spacing is provided between the organic layers 11B, 11G and 11R at parts of the areas between the pixel openings A, and, therefore, the display apparatus 1' constituted as described referring to FIGS. 4A to 4C and FIG. 5 can be obtained.

The present invention is not limited to the details of the above described embodiments. The scope of the invention is defined by the appended claims and all changes and modifications as fall within the equivalence of the scope of the claims are therefore to be embraced by the invention.

What is claimed is:

1. A display apparatus comprising:
   a plurality of lower electrodes patterned on a substrate in pixels;
   an auxiliary wiring disposed between adjacent lower electrodes at the same level as said lower electrodes and insulated from said lower electrodes;
   an insulating film formed on said substrate, said insulating film having pixel openings for exposing central portions of said lower electrodes and connection holes reaching said auxiliary wiring;
   an organic layer provided in each pixel covering bottom portions of said pixel openings, said organic layer in each pixel including a portion that overlaps at least a portion of the organic layer in an adjacent pixel of said pixels; and
   an upper electrode covering said organic layer and connected to said auxiliary wiring through one of said connection holes in each pixel
   wherein,
   said overlapping portion of the organic layer is positioned above the auxiliary wiring.

2. A display apparatus as set forth in claim 1, wherein said substrate comprises an inter-layer insulating film covering a thin film transistor substrate provided with thin film transistors for driving said pixels, and each of said lower electrodes is connected to each of said thin film transistors through a connection hole formed in said inter-layer insulating film.

3. A display apparatus as set forth in claim 2, wherein said organic layer has end portions partly overlapping themselves and said upper electrode covers said organic layer and is connected to said auxiliary wiring through said connection holes between portions of said organic layer.

4. A display apparatus as set forth in claim 3, wherein said lower electrodes have a three-layer structure.

5. A display apparatus as set forth in claim 4, wherein said lower electrodes each comprise a reflective metallic material layer sandwiched between conductive oxide material layers.

6. A display apparatus as set forth in claim 4, wherein said lower electrodes are formed of a light-reflective material.

7. A display apparatus as set forth in claim 1, wherein said upper electrode is light-transmitting.

* * * * *